Sept. 15, 1970 J. F. BELL ET AL 3,528,307
DRIVE MECHANISM FOR A TELEVISION CONTINUOUS TUNER
Filed Dec. 4, 1968 2 Sheets-Sheet 1

Inventors
John F. Bell
George R. Dickinson
By James E. Tracy
Attorney

Sept. 15, 1970 J. F. BELL ET AL 3,528,307

DRIVE MECHANISM FOR A TELEVISION CONTINUOUS TUNER

Filed Dec. 4, 1968

2 Sheets-Sheet 2

Inventors
John F. Bell
George R. Dickinson

By James E. Tracy
Attorney

United States Patent Office 3,528,307

Patented Sept. 15, 1970

3,528,307

DRIVE MECHANISM FOR A TELEVISION CONTINUOUS TUNER

John F. Bell, Willmette, and George R. Dickinson, Norridge, Ill., assignors to Zenith Radio Corporation, Chicago, Ill., a corporation of Delaware Filed Dec. 4, 1968, Ser. No. 780,952
Int. Cl. F16h 35/18
U.S. Cl. 74—10.8 11 Claims

ABSTRACT OF THE DISCLOSURE

A drive mechanism for achieving both coarse and fine tuning of a continuously adjustable type tuner, such as a UHF tuner, is provided by employing a channel selector knob to rotate a drive pin which in turn frictionally drives a disc connected to the tuner's tuning shaft. The friction drive is established by a clamping arrangement which applies statically balanced, diametrically opposed forces to the drive pin and to the disc to urge their peripheries into engagement without introducing any side loading or thrust to the tuning shaft and thus without loading the shaft's bearings. As a consequence, very low torque is required to actuate the drive mechanism and position the tuning shaft; and, with the aid of a flywheel, permits the selector knob to be spun to obtain fast advance or coarse tuning, while slower knob rotation achieves fine tuning.

BACKGROUND OF THE INVENTION

This invention pertains to a novel drive mechanism for positioning the tuning shaft of a continuously adjustable type tuner to selectively tune a television receiver to different television channels. The invention particularly lends itself to adjusting a UHF continuous tuner, and will be described in such an environment.

A UHF tuner, in accordance with United States standards, must be capable of selectively tuning to any one of 70 channels which make up the UHF band. To fulfill this requirement UHF tuners are usually of the continuously variable type, having three tunable circuits operating in conjunction with oscillator and mixer stages to develop an IF (or intermediate frequency) signal at the mixer's output by heterodyning a selected RF (or radio frequency) signal with the oscillator signal. Two of the tunable circuits constitute frequency selectors, each of which is to be tuned to the RF signal of the desired UHF channel, coupled in cascade between the tuner's input and an input of the mixer. The oscillator, whose output is coupled to another input of the mixer, contains the third tunable circuit which forms the frequency-determining circuit of the oscillator.

Each of the tunable circuits generally includes a variable air dielectric capacitor as its adjustable tuning element, the three capacitors being ganged to a single common tuning shaft. Each capacitor has at least one rotor plate affixed to the tuning shaft and in less than a complete revolution (usually over an angular distance of about 180°) continuous tuning over the entire UHF range is achieved by the tuner. This means that in a conventional tuner only approximately 2.6° of shaft rotation is devoted to each of the 70 channels. A small angular displacement of the tuning shaft thus covers a substantial segment of the UHF band and this makes the shaft extremely sensitive to adjustment. It must be very carefully manipulated in order to tune to a particular desired UHF channel. For this reason, complex and costly mechanical drive mechanisms, involving many separate parts and taking up considerable space, have been found to be necessary in the past to insure precision UHF tuning.

A two-speed vernier drive of some type is customarily employed to obtain, within a relatively short time, accurate tuning to any channel in the UHF range. A vernier drive facilitates both coarse or fast tuning, namely relatively rapid turning of the tuning shaft to reach as soon as possible the vicinity of a desired channel, and fine or slow tuning to effect extremely slow shaft rotation to ease the search for the exact angular position required to achieve precise tuning to the desired channel. Conventionally, vernier drive mechanisms are either of the two-knob or one-knob variety. With two knobs, two different gearing arangements are used. One has a low turning ratio for fast advance of the tuning shaft, while the other has a high turning ratio to accomplish slow shaft rotation. The one knob version realizes coarse and fine tuning usually by an extremely complex and expensive system of cams, levers, gears and clutches.

The prior two-speed vernier drives, due partially to their complex construction, are subject and prone to malfunctioning and this is particularly true with respect to the one-knob vernier drives used heretofore. Moreover, the substantial number of moving parts in these prior arrangements usually result in a significant amount of backlash. Because of the accumulated "play" of all the moving parts, the previous drive mechanisms have to be effectively "wound up" before the tuning shaft even begins to move. With such backlash, initial rotation of a channel selector knob cannot be instantly translated into tuning shaft rotation. There is an undesired inherent or built-in lag in most of the knob-to-shaft transmission systems of the vernier drives previously developed.

Tuner drives with low backlash have been developed, but at the expense of efficiency. Systems of tightly coupled parts with substantial friction have been employed to reduce backlash, necessitating a large torque to accomplish tuning shaft rotation. The work out of such inefficient systems is very small compared to the work in. The losses are considerable. In the past, the objectives of low friction and low backlash were incompatible. A compromise always had to be made between efficiency and backlash.

Furthermore, in many of these prior drives undesired side loading is imparted to the tuning shaft (namely forces normal to the shaft's axis and which tend to cant or tilt the shaft) which in turn load the bearings in which the shaft is normally journalled. This appreciably increases the friction or drag that must be overcome to adjust the tuner. Bearing loads not only increase the amount of torque required on the part of the user to turn the channel selector knob but may result in bearing wear, as a consequence of which the tuning shaft will be subject to lateral "play" which will cause tuning instability and picture distortion. Even more important, it results in imperfect centering of the tuning shaft in its bearings which produces erratic fine tuning.

The present invention is calculated to overcome all of the above-mentioned disadvantages and shortcomings of the prior vernier drive mechanisms. A unique low-friction mechanism, requiring few components and little space, has been devised for achieving both coarse and fine tuning under control of a single selector knob. It exhibits a very high turning ratio to simplify fine tuning and yet it involves no elaborate or sophisticated transmission system. The relative noncomplexity of applicants' construction reflects a substantial cost saving over prior conventional drives. Moreover, the present drive experiences insignificant backlash while being highly efficient, is extremely reliable and trouble-free, produces no side forces or loading on the tuning shaft, and needs very little torque to effect shaft rotation.

Accordingly, it is an object of the invention to provide a new and improved tuner drive mechanism to effect selective tuning to any of a plurality of different television channels, such as to any of the channels in the UHF band.

It is another object to provide a novel drive mechanism for a continuously adjustable UHF tuner.

A further object of the invention is to provide a compact, low-cost, backlash-free, low-torque, highly efficient, low-friction, trouble-free, one-knob drive mechanism capable of achieving coarse and fine tuning of a continuously adjustable type television tuner.

Another object is to provide a low-inertia tuner drive mechanism.

SUMMARY OF THE INVENTION

A drive mechanism, for the tuning shaft of a continuously adjustable type television tuner, constructed in accordance with one aspect of the invention comprises a rotatably mounted disc which is mechanically coupled to the tuning shaft to facilitate positioning thereof. At least a portion of the disc's periphery is arcuate shaped. There is a rotatably mounted drive pin or shaft whose axis of rotation is spaced from and parallel to that of the disc. Clamping means, including a tensioned resilient member lying in substantially the same plane as the disc, are provided for imparting statically balanced, diametrically opposed forces to the drive pin and to the disc to urge the pin and the disc's arcuate shaped peripheral portion into engagement to effect a friction drive therebetween without introducing any side loading to the tuning shaft. The drive mechanism also includes means for effecting continuous rotation of the drive pin to actuate the tuning shaft to different angular positions to achieve tuning to different television channels.

DESCRIPTION OF THE DRAWINGS

The features of the invention which are believed to be novel are set forth with particularity in the appended claims. The invention, together with further objects and advantages thereof, may best be understood, however, by reference to the following description in conjunction with the accompanying drawings in which:

DESCRIPTION OF THE ILLUSTRATED EMBODIMENT

Figures 1, 1A, 2:
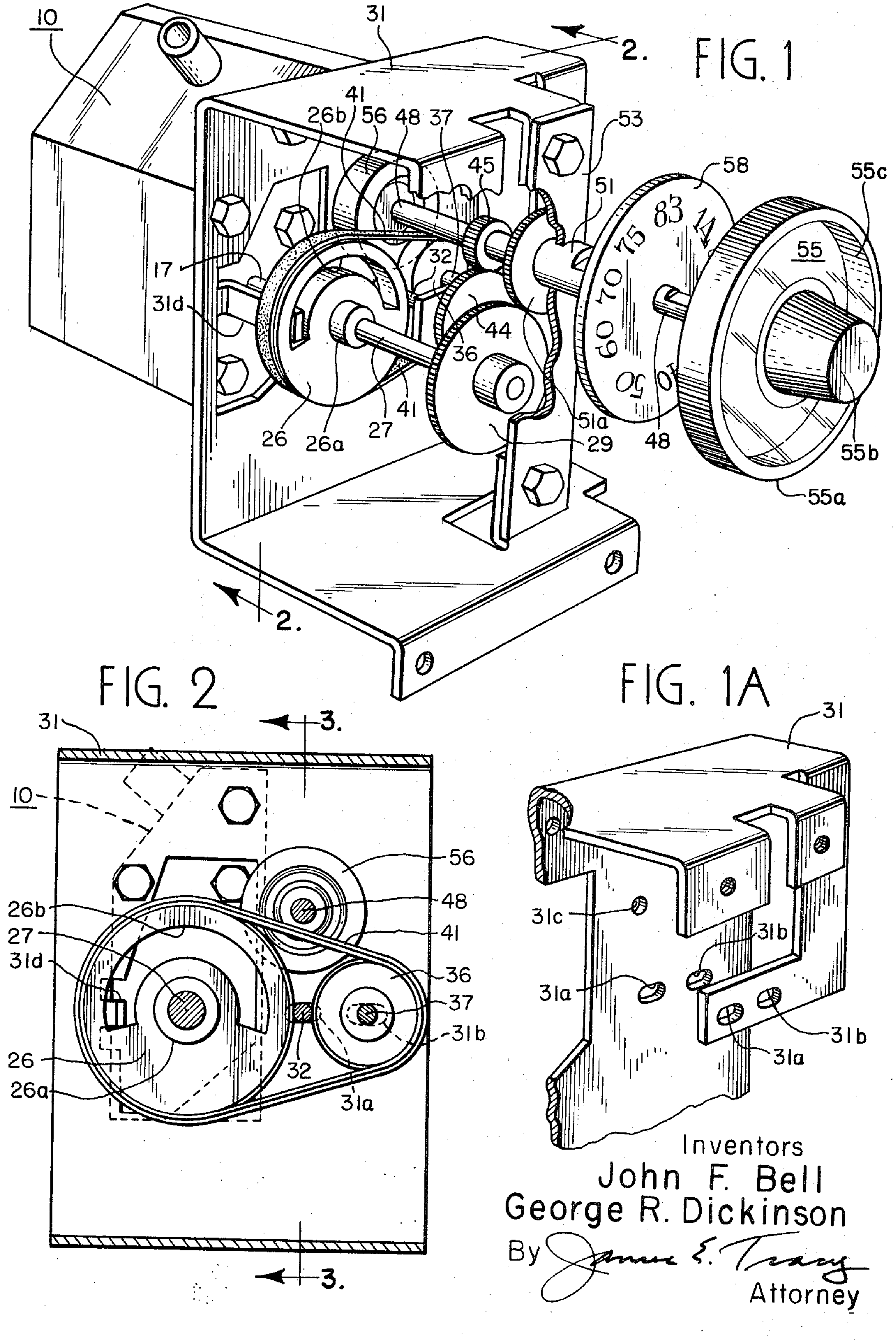
FIG. 1 is a perspective view, partially broken away and exploded, of a UHF continuous tuner and an associated drive mechanism embodying the invention.
FIG. 1A is a fragmentary perspective view of a portion of one of the components of the drive mechanism.
FIG. 2 is a sectional view taken along section line 2—2 of FIG. 1.

The nature of the continuous tuner to be adjusted by applicants' unique actuating apparatus is of no particular moment to the present invention. In fact, the tuner need not even have to be capable of selecting channels in the UHF band; it may, for example, be a tuner designed to continuously tune through the twelve channels of the VHF band. As another alternative, the drive mechanism of the invention may control an all-channel continuous tuner which can select any channel in either the VHF or UHF band. Moreover, the tuning shaft does not necessarily have to adjust air capacitors to effect tuning. Many other devices may be varied by the tuning shaft to accomplish tuning. For example, the tuning shaft may position a potentiometer to provide a D.C. voltage of variable magnitude for application to one or more voltage controlled variable capacitance diodes. For convenience, the invention is shown in connection with a particular UHF tuner 10 which has been widely used commercially by the present assignee.

Conventionally, each of the three tunable circuits in a UHF tuner has an inductance coil and a capacitor, one of which has an adjustable effective impedance for determining the condition of tuning. Structurally, a most convenient form of tunable circuit has a variable capacitor of the air-dielectric variety which permits ganging of the three capacitors respectively included in the three tuned circuits. Each capacitor has one or more stator plates and one or more rotor plates, the movable plates of the capacitors being supported on and fixed to a common tuning shaft for variable displacement relative to their associated stator plates to accomplish tuning. The tuning shaft must be positioned to different angular positions to appropriately adjust the capacitors to achieve tuning to different channels in the UHF band.

Such is the case with UHF tuner 10 shown in the drawings. The illustration of the tuner has been confined to only so much of the tunable circuits themselves as necessary to make clear the coupling of the drive mechanism to those circuits and their controlled tuning made possible by that mechanism. The circuitry of which the tunable circuits may be part is of no particular concern to the invention but, for convenient reference, a desirable form of electrical system including tunable circuits of the type indicated is the subject of a copending application Serial No. 343,281, filed Feb. 7, 1964, in the name of Wayne H. Reynolds, and assigned to the assignee of this invention.

For the embodiment under consideration, tuner 10 has three generally similar series-resonant tunable circuits 11, 12 and 13, each of which includes a pair of capacitor rotor plates **11*a*, 12*a* and 13*a*, respectively, and a stator capacitor plate 11*b*, 12*b* and 13*b*, respectively. Tuned circuits 11, 12 and 13 also individually include a respective one of three inductance coils 11*c*, 12*c* and 13*c***. Each of the three stator plates is a planar extension of an associated one of the coils.

The three pairs of rotor plates are mounted on and supported by a metallic tuning shaft 17 to achieve simultaneous displacement of the rotor plates relative to their associated stator plates to tune the tunable circuits concurrently over frequency ranges related to the UHF band. More particularly, tuner 10 operates in accordance with the superheterodyne technique in which a selected RF signal and a local oscillator signal are beat in a mixer to produce at the mixer's output an IF signal whose frequency is the difference between the frequencies of the RF and oscillator signals. Tuned circuits 11 and 12 are, more specifically, frequency selectors since they are coupled in cascade between the input of the tuner (which input is connected to an antenna) and one input of the mixer and are both to be tuned to the selected UHF channel, while tuned circuit 13 functions as a frequency-determining circuit as it establishes the frequency of the oscillator. For any given selected channel, frequency-determining circuit 13 is to be tuned to resonate at a frequency separated from the frequency of the selected channel by the amount of the intermediate frequency. Tuning to each of the 70 UHF channels is attained by turning shaft 17 through an angular distance of approximately 180°.

Figures 3, 4:
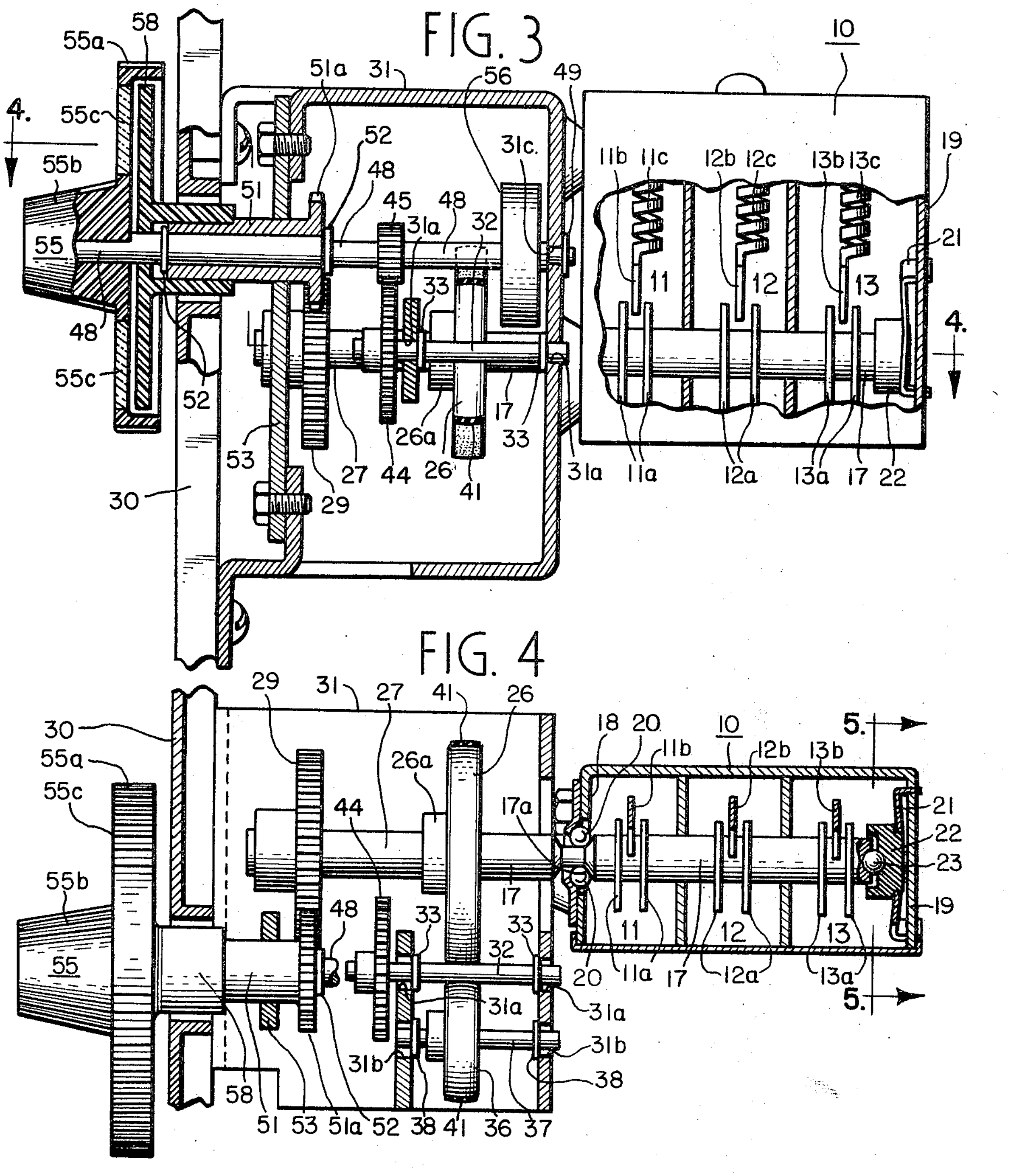
FIG. 3 is a sectional view of both the drive mechanism and the UHF tuner taken along section line 3—3 in FIG. 2 and additionally discloses a portion of an escutcheon to illustrate the manner in which the tuning apparatus is mounted in a television cabinet.
FIG. 4 is a sectional view of the FIG. 3 disclosure taken along section line 4—4 in FIG. 3; and, FIG. 5 is a fragmentary sectional view taken along section line 5—5 in FIG. 4.
Figure 5:
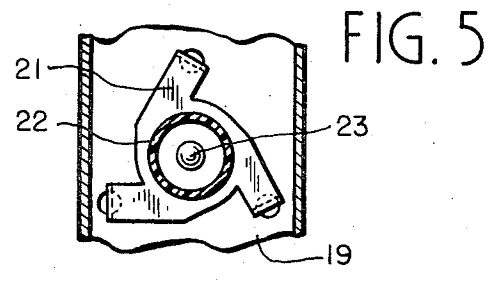

Suitable bearing structures may be employed to rotatably mount tuning shaft 17 to the end walls 18, 19 of the tuner housing. As seen in FIG. 4, a constricted or reduced diameter portion of shaft 17 is journalled in an aperture of wall 18 by means of a ball bearing structure illustrated by two metallic balls 20. Support of shaft 17 to end wall 19 is provided by an arrangement of a three-fingered spider spring 21, a plastic housing 22 and a metallic bearing ball 23. Spring 21 is tensioned to urge or bias ball 23 and shaft 17 toward wall 18. As a result of the spring tension, bearing balls 20 abut and are held against the shoulder **17*a* of the constricted portion of shaft 17. In this way, spring 21 effectively locks shaft 17 against axial movement so that the spacing between the plates of each capacitor does not vary,. The force exerted by spring 21, however, is only as large as necessary to restrict such axial movement. A minimal amount of friction is introduced between bearing balls 20 and 23 and the surfaces of shaft 17** engaged thereby in order that the shaft may be turned with very little torque.

Consideration will now be given to the drive mechanism, in which the invention is embodied, for positioning tuning shaft 17. A rotatably mounted disc 26 is mechanically coupled to shaft 17 to effect rotation thereof concurrent with and in response to rotation of the disc. Specifically, disc 26 is rigidly affixed to and concentric with tuning shaft 17. The disc may take any of a variety of different configurations; the only requirement, for reasons to be apparent, is that at least a portion of its periphery or rim be of arcuate or curved shape. In the illustrated embodiment, disc 26 in general takes the form of a wheel and more specifically constitutes a pulley. A shaft 27 is rigidly secured to a hub portion 26*a* of pulley 26 to effectively provide an extension of tuning shaft 17. Rigidly affixed to shaft extension 27 is a gear 29, preferably made of plastic, employed to position a channel indicator display disc in a manner to be explained. Suffice it to say at this juncture that gear 29 rotates in unison with tuning shaft 17 and thus the angular position or orientation of gear 29 reflects the particular channel to which tuner 10 is tuned.

A metallic support bracket 31 is secured, such as by means of screws, to end wall 18 of tuner 10 and also to an escutcheon 30 (portions of which are shown in FIGS. 3 and 4) of a television cabinet. Disc 26 is driven by a rotatably mounted metallic drive pin or shaft 32 journalled in a pair of apertures 31*a* provided in spaced-apart portions of bracket 31, best seen in FIG. 1A. Pin 32 is oriented so that its axis of rotation is spaced from and parallel to that of disc 26. It is locked against axial movement by a pair of C-shaped snap washers 33 which respectively snap into a pair of cooperating annular grooves in the pin. Note, particularly in FIG. 1A, the oval configurations of apertures 31*a*. This permits a limited degree of lateral movement of pin 32, in a direction normal to its axis and in the plane defined by the axes of disc 26 and pin 32. Such restricted freedom of movement facilitates urging and holding the drive pin into engagement with the peripheral surface or rim of disc 26, by a clamping means to be described, to establish a friction drive between the pin and disc.

More specifically, the clamping means comprises a disc in the form of an idler wheel or pulley 36 rigidly secured to a shaft or pin 37 which in turn is mounted for free rotation in a pair of apertures 31*b* in support bracket 31, see especially FIG. 1A. Annular grooves in shaft 37 and a pair of C-shaped snap washers 38 captivate shaft 37 with respect to axial movement. As in the case of holes 31*a*, apertures 31*b* are dimensioned to permit a limited amount of movement of pin 37 normal to its axis. Discs 26 and 36 lie in the same plane, and the axis of disc 36 is parallel to and coplanar with the axes of pin 32 and disc 26. Elements 26, 32 and 37 are appropriately spaced and apertures 31*a* and 31*b* dimensioned, so that drive pin 32 may simultaneously engage the peripheries of both discs 26 and 36, as is best seen in FIGS. 2 and 4.

Drive pin 32 is effectively pressed and retained in engagement with the periphery of disc 26 by a resilient member, included in the clamping means, which in the illustrated case takes the form of an elastic belt 41 that couples each of discs 26, 36 toward the other. Note, particularly in FIG. 4, the slight crowning of the rims on which belt 41 rides. The cross section of belt 41 has a conforming curvature and this is sufficient to captivate the belt onto the peripheral surfaces of the pulleys.

Belt 41 is dimensioned and given an appropriate resiliency to provide only as much pressure as is necessary to establish a friction drive between drive pin 32 and disc 26. In other words, when pin 32 is revolved, in a manner to be explained, it must effect rotation of disc 26. There should be no slippage or sliding friction between the peripheries of pin 32 and disc 26. The particular form of discs 26 and 36 selected for the disclosed embodiment insures that there will be zero, or at least a negligible amount of, sliding friction between belt 41 and discs 26 and 36, and between pin 32 and the peripheries of discs 26 and 36. The peripheral surface speeds of all four elements 26, 32, 36 and 41 will be substantially identical, which is a necessary condition to preclude sliding friction. This would not be the case, however, if pulleys 26 and 36 had grooved rims to accommodate the elastic belt.

A salient feature of the invention resides in the manner in which forces are introduced to maintain pin 32 and disc 26 in frictional driving relationship. To follow the teachings of the prior art, pin 32 would be urged and held into engagement with disc 26 by means of some biasing device, such as a spring-loaded lever, referenced to mounting bracket 31. One point or end of the biasing device would be fixed to bracket 31 and this would mean that the force holding the pin and disc in contact would produce an indesired loading on the tuning shaft, namely an increase in the friction between the shaft and its bearings.

To explain further, a biasing device of the prior art would produce a force at the point of engagement of pin 32 and disc 26 and in a direction toward and normal to the disc's axis. Unfortunately, employing such a prior technique results in the development of side loading on tuning shaft 17. The force toward the disc's axis effectively creates a clockwise moment on shaft 17 (as viewed in FIG. 4) with bearing structure 20 as the fulcrum, as a consequence of which a force normal to the shaft's axis will exist at the fulcrum and produce a bind or friction to load the bearing. Side loading will also develop where shaft 17 is rotatably supported by bearing ball 23. The force on disc 26 tends to cant or tilt the entirety of shaft 17. Hence, the right end of shaft 17, as viewed in FIG. 4, is pressed downwardly against bearing ball 23 and housing 22 to increase the friction at bearing 23. The tendency for shaft 17 to rock in a clockwise direction also causes an end thrust or loading on bearing 23 in the direction toward end wall 19.

The side loading or forces created on the tuning shaft by the employment of prior art type friction drives results in an appreciable amount of friction to resist shaft rotation. Accordingly, a very significant amount of torque is needed to overcome that resistance and turn the tuning shaft. With the present invention, no side loading manifests on shaft 17 since the force imparted on drive pin 32 to move and hold it into engagement with disc 26 is effectively cancelled or balanced by a diametrically opposed force. This occurs since the force on pin 32 is not referenced to bracket 31. By permitting limited lateral movement of pins 32 and 37 and by journalling shaft 17 only in the bearings of tuner 10, the clamping means effectively "floats" so that a statically balanced system ensues. With such an arrangement, pin 32 and disc 26 are urged into engagement by the application of a first force of a predetermined magnitude on the disc (where the pin and disc engage) in a direction toward and normal to the disc's axis, while at the same time a second force of the same predetermined magnitude is applied on the pin (where it engages disc 26) in the direction opposite to that of the first force, namely toward and normal to the pin's axis. A net force, normal to the tuning shaft's axis, of zero will result thereby precluding loading of bearings 20 and 23.

Means are included in the drive mechanism for effecting continuous rotation of drive pin 32 in order to actuate tuning shaft 17 to different angular positions. More particularly, a plastic gear 44 is rigidly secured to one end of drive pin 32 and engages a plastic gear 45, of much smaller diameter, which in turn is rigidly affixed to a metallic control shaft 48, a reduced diameter end portion of which is journalled for free rotation in an aperture 31*c* in mounting bracket 31. The expedient of reducing the diameter for journalling, in conjunction with the provision of a C-shaped snap washer 49, locks control shaft 48 against axial movement. Shaft 48 constitutes the inner one of a pair of independently rotatable concentrically arranged shafts, the outer shaft 51 (preferably made of plastic) being locked to inner shaft 48 against relative axial movement by a pair of C-shaped snap washers 52. Additional support for concentric shafts 51, 48 is provided by a metallic support member or strap 53 rigidly affixed, such as by screws, to bracket 31. Specifically, outer shaft 51 is journalled in an aperature in strap 53.

A rotatable UHF channel selector knob 55 is affixed to inner shaft 48 by providing a flat on the shaft and shaping the bore of the knob to have a mating cross-sectional configuration. Knob 55 is thus mechanically coupled to drive pin 32 via a gearing arrangement comprising gears 44 and 45. The diameters of those gears plus the diameters of pin 32 and disc 26 are such that a turning ratio of 90:1 is realized, namely selector knob 55 must be rotated 90 revolutions to achieve a single revolution of tuning shaft 17. However, since shaft 17 must be turned only approximately 180° to scan the entire UHF band, knob 55 need be rotated only about 45 revolutions to tune through the UHF band. A flywheel 56, having a considerable moment of inertia, is rigidly secured to shaft 48 to facilitate fast advance of shaft 17 and consequent coarse tuning. Cutaway section 26*b* of disc 26 cooperates with a stop 31*d*, sheared and formed out of bracket 31, to limit the travel of disc 26 to only the angular range necessary to accomplish UHF tuning.

Since 45 revolutions of knob 55 effect tuning through all 70 UHF channels, approximately 230° of knob rotation $$\left(\frac{45\times 360}{70}\right)$$

will be devoted or allocated to each channel. Obviously, this allows extremely fine tuning, Knob 55 has an annular rim portion 55*a* which may be gripped and manually revolved to effect slow knob rotation. Spinning of knob 55, and thus spinning of flywheel 56, to achieve coarse tuning is made most convenient by shaping the knob to have a reduced diameter or hub section 55*b* which may easily be spun to effect tuning through the entire UHF band in a relatively short time. Of course, it is due to the extremely low friction presented to the tuning shaft that spinning of knob 55 may be accomplished. Very low torque is needed to revolve gears 44 and 45. Hence, with the absence of side loading on the tuning shaft, the entire transmission system from knob 55 to shaft 17 may be actuated with relatively little turning torque. If desired, flywheel 56 need not be a separate element. It may be integrated into and combined with knob 55.

Another feature of the invention lies in the negligible backlash presented by the drive mechanism. Elements 26, 32 and 36 are each preferably constructed of a relatively rigid, nonresilient material (such as metal or hard plastic) and thus no surfaces need be deformed (i.e., compressed or stretched) before knob rotation is translated into shaft rotation. Only two gears (exhibiting insignificant backlash) are included in the gear train between knob 55 and drive pin 32 in order that rotation of knob 55 will be instantly transmitted to drive pin 32. No wind up is needed in applicants' drive mechanism before knob rotation produces shaft rotation. In this connection, while elastic belt 41 does not contribute any appreciable backlash, it may be desirable to employ instead a metallic band with a small series-connected resilient device, such as a coil spring, to minimize still further the amount of deforming that takes place between knob and shaft rotation.

It will be observed that the axes of gears 44 and 45 effectively form a plane which is generally normal to the plane defined by the coplanar axes of disc 26 and pin 32. This arrangement is preferred since gear 44 moves (but gear 45 does not) when pin 32 moves laterally in its apertures 31*a* and it is necessary that the teeth of gears 44 and 45 do not bind or jam.

Channel indication is displayed to the user by a disc 58 supported on and keyed to outer shaft 51. A gear 51*a*, formed at one end of shaft 51, meshes with plastic gear 29 which rotates concurrently with tuning shaft 17. Gear 51*a*, and consequently channel indicator disc 58, thus turn in response to rotation of shaft 17. The gear ratio of gears 29 and 51*a* is such that one-half of a revolution of shaft 17 effects almost a complete revolution of disc 58. In this way, the UHF channel numbers may be distributed around the entire periphery or circumference of the disc to ease channel selection. Of course, for any orientation of disc 58 the number appearing at the top represents the UHF channel to which tuner 10 is tuned at the time. Since disc 58 lies behind knob 55, a transparent disc portion 55*c* is provided in the knob between rim portion 55*a* and hub portion 55*b*.

The drive mechanism may, of course, be actuated by means other than a manually operated channel selector knob. For example, pin 32 may be motor driven, the motor being controlled either at the television set itself or at a location remote therefrom. Furthermore, for some applications of the invention it may be desirable to eliminate flywheel 56. Actually, in the absence of the flywheel the drive mechanism exhibits negligible inertia, due primarily to the fact that the fast moving elements (i.e., shaft 48 and gear 45) have relatively small diameters and thus small moments of inertia as compared to the slow moving parts. This feature is of importance when the invention is incorporated in, for example, a servo drive mechanism or a signal-seeking drive mechanism where it is essential that tuning shaft rotation stops instantly in response to cessation of applied driving power at the input of the transmission system.

Applicants' compact drive mechanism is substantially less complex and expensive than prior two-speed drive mechanisms for achieving both coarse and fine tuning. Moreover, the present construction is much more trouble free than the drives developed heretofore. The very low torque needed to actuate the drive mechanism is attributable primarily to applicants' novel system employing statically balanced forces to establish a friction drive without transmitting any force to the tuning shaft either normal to or collinear with the shaft's axis. In addition, a low-friction, highly efficient transmission system is obtained with negligible backlash.

While a particular embodiment of the invention has been shown and described, it will be obvious to those skilled in the art that changes and modifications may be made without departing from the invention in its broader aspects, and, therefore, it is intended in the appended claims to cover all such modifications and changes as may fall within the true spirit and scope of the invention.

We claim:

1. A drive mechanism for positioning the tuning shaft of a continuously adjustable type tuner to tune a television receiver to any selected one of a plurality of television channels, comprising:

a rotatably mounted disc mechanically coupled to said tuning shaft to facilitate positioning thereof and having at least a portion of its periphery of arcuate shape;

a rotatably mounted drive pin having its axis of rotation spaced from and parallel to that of said disc;

clamping means, including a tensioned resilient member lying in substantially the same plane as said disc, for imparting statically balanced, diametrically opposed forces to said drive pin and to said disc to urge said pin and the disc's arcuate shaped peripheral portion into engagement to provide a friction drive therebetween without introducing any side loading to said tuning shaft;

and means for effecting continuous rotation of said drive pin to actuate said tuning shaft to different angular positions to achieve tuning to different television channels.

2. A drive mechanism according to claim 1 in which said disc is rigidly affixed to and concentric with said tuning shaft.

3. A drive mechanism according to claim 1 in which said clamping means applies a first force of a predetermined magnitude on said disc in a direction toward and normal to the disc's axis and applies a second force, of said same predetermined magnitude, on said pin in a direction opposite to that of said first force and normal to the pin's axis.

4. A drive mechanism according to claim 1 in which said drive pin is journalled in apertures in a pair of spaced apart support members, and in which said apertures are dimensioned to permit a limited degree of lateral movement of said pin in the plane defined by the axes of of said disc and pin in order that said pin and disc may be moved into and held in engagement by said clamping means.

5. A drive mechanism according to claim 1 in which said tuning shaft is journalled in at least one bearing and in which the forces applied by said clamping means effectively cancel to produce on said tuning shaft, and normal to its axis, a net force of zero thereby to preclude loading of said bearing.

6. A drive mechanism according to claim 1 in which said means for effecting rotation of said drive pin includes a driven gear, rigidly affixed to and concentric with said pin, and a drive gear coupled to said driven gear, the axes of rotation of said drive gear and said pin being coplanar and defining a plane which is generally normal to the plane defined by the coplanar axes of said disc and said pin.

7. A drive mechanism according to claim 1 in which said means for effecting rotation of said drive pin includes a flywheel to facilitate relatively fast rotation of said tuning shaft.

8. A drive mechanism according to claim 7 in which said tuner is a UHF tuner, and wherein said means for effecting rotation of said drive pin includes a UHF channel selector knob, and in which said flywheel and said knob are integrated and combined into a single element.

9. A drive mechanism according to claim 1 in which said tuner is a UHF tuner and wherein said means for effecting rotation of said drive pin includes a UHF channel selector knob mechanically coupled to said pin via a gearing arrangement.

10. A drive mechanism according to claim 1 in which said disc takes the form of a wheel and in which said resilient member is an elastic belt.

11. A drive mechanism according to claim 1 in which said disc is a driven pulley and in which said clamping means includes a rotatably mounted idler pulley lying in the same plane as said driven pulley and whose axis of rotation is parallel to and coplanar with the axes of said pin and said driven pulley, with the pin's axis located between the axes of the two pulleys, and wherein said resilient member is an elastic belt coupling one pulley to and toward the other such that said pin engages the peripheries of both of said pulleys and, when driven, causes rotation of said pulleys.

References Cited

UNITED STATES PATENTS

| | | | |
|---|---|---|---|
| 297,407 | 4/1884 | Jenkin | 74—209 |
| 2,177,760 | 10/1939 | Wheat | 74—10.8 |

MILTON KAUFMAN, Primary Examiner

U.S. Cl. X.R.

74—209